(12) United States Patent
Liu et al.

(10) Patent No.: US 11,826,998 B2
(45) Date of Patent: Nov. 28, 2023

(54) FLEXIBLE DISPLAY PANEL LAMINATION DEVICE

(71) Applicants: Chengdu BOE Optoelectronics Technology Co., Ltd., Sichuan (CN); BOE Technology Group Co., Ltd., Beijing (CN)

(72) Inventors: Shaokui Liu, Beijing (CN); Wei Qing, Beijing (CN); Zhihui Wang, Beijing (CN); Xingguo Liu, Beijing (CN); Zuquan Chen, Beijing (CN); Wei Zeng, Beijing (CN); Danping Shen, Beijing (CN); Yue Wei, Beijing (CN); Ce Wang, Beijing (CN); Qiang Tang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 82 days.

(21) Appl. No.: 17/425,337

(22) PCT Filed: Jan. 6, 2021

(86) PCT No.: PCT/CN2021/070502
§ 371 (c)(1),
(2) Date: Jul. 23, 2021

(87) PCT Pub. No.: WO2021/147677
PCT Pub. Date: Jul. 29, 2021

(65) Prior Publication Data
US 2022/0314593 A1    Oct. 6, 2022

(30) Foreign Application Priority Data

Jan. 20, 2020    (CN) .................. 202020133610.X

(51) Int. Cl.
*B32B 37/10*    (2006.01)
*B32B 37/00*    (2006.01)
(Continued)

(52) U.S. Cl.
CPC .......... *B32B 37/10* (2013.01); *B32B 37/0046* (2013.01); *B32B 37/18* (2013.01); *H10K 71/00* (2023.02); *B32B 2457/206* (2013.01)

(58) Field of Classification Search
CPC .......... B32B 2457/206; B32B 38/1866; B32B 37/0046; B32B 37/10; B32B 2457/20–208; H01L 2251/5338
See application file for complete search history.

(56) References Cited

U.S. PATENT DOCUMENTS

2016/0021764 A1* 1/2016 Lee ...................... H05K 5/0217
                                                                156/196
2018/0056638 A1* 3/2018 Choi ...................... B32B 37/10
(Continued)

FOREIGN PATENT DOCUMENTS

CN    106585045 A     4/2017
CN    207954939 U  * 10/2018
(Continued)

OTHER PUBLICATIONS

International Search Report for PCT/CN2021/070502 dated Mar. 26, 2021.

*Primary Examiner* — Carson Gross
(74) *Attorney, Agent, or Firm* — Ling Wu; Stephen Yang; Ling and Yang Intellectual Property

(57) ABSTRACT

The present disclosure relates to the technical field of display product preparation, and in particular discloses a flexible display panel lamination device which is used for laminating a to-be-laminated flexible display panel onto a cover plate, and includes a base and an elastic lamination part arranged on the base. The elastic lamination part is provided with a first surface for bearing the to-be-laminated flexible display panel and a second surface opposite to the first surface; the second surface is symmetrically provided with two supporting protruding ribs; the two supporting
(Continued)

protruding ribs are respectively fixed in two fixation grooves formed on the base; a gap is formed between a portion, located between the two supporting protruding ribs, of the second surface of the elastic lamination part and the base; and a portion, close to the edge, of the second surface of the elastic lamination part is supported on the base.

19 Claims, 5 Drawing Sheets

(51) Int. Cl.
  *B32B 37/18* (2006.01)
  *H10K 71/00* (2023.01)

(56) References Cited

U.S. PATENT DOCUMENTS

| | | | |
|---|---|---|---|
| 2019/0329540 A1* | 10/2019 | Kim | B32B 38/0012 |
| 2019/0348641 A1* | 11/2019 | Jung | G06F 1/1626 |
| 2022/0063179 A1* | 3/2022 | Zhang | B29C 63/02 |

FOREIGN PATENT DOCUMENTS

| | | | |
|---|---|---|---|
| CN | 109764041 A | 5/2019 | |
| CN | 209216462 U | 8/2019 | |
| CN | 209297653 U | 8/2019 | |
| CN | 209813359 U | 12/2019 | |
| CN | 212097892 U | 12/2020 | |
| KR | 10-2018-0116510 A | 10/2018 | |

\* cited by examiner

FLEXIBLE DISPLAY PANEL LAMINATION DEVICE

CROSS-REFERENCE TO RELATED APPLICATIONS

The present application is a U.S. National Phase Entry of International Application No. PCT/CN2021/070502 having an international filing date of Jan. 6, 2021, which claims the priority of Chinese patent application No. 202020133610.X filed to CNIPA on Jan. 20, 2020, entitled "Flexible Display Panel Lamination Device". The entire contents of the above-identified applications are hereby incorporated by reference.

TECHNICAL FIELD

Embodiments of the present disclosure relate to, but are not limited to, the technical field of display product preparation, and particularly relate to a flexible display panel lamination device.

BACKGROUND

Currently, an Organic Light-Emitting Diode (OLED) flexible display panel as a display part of electronic equipment has been widely applied in various electronic products, with the development of a curved screen, a glass cover plate outside an OELD module is diversified in form, and a multi-curved glass cover plate becomes a new trend, resulting in that higher requirements are put forward for a full lamination technology of the glass cover plate and the OLED flexible display panel.

A lamination device for laminating the glass cover plate and the OLED flexible display panel is liable to cause an insufficient stress at a bent region of the flexible display panel and thus generate bubbles, or liable to cause an uneven stress at a transitional position between a flat region and the bent region of the flexible display panel and thus generate cracks, and for example, is liable to cause cracks at a thin film encapsulation layer of the flexible display panel, resulting in that the thin film encapsulation layer has a failure, then water and oxygen enter and corrode a light-emitting layer material to cause a display failure of the OLED module. Some cracks generated during lamination have the hysteresis risk, and can be stimulated after standing is carried out for tens of days, resulting in serious influence on consumer experience. The problems of the bubbles and the cracks generated in the laminating process will seriously influence lamination yield.

SUMMARY

The following is an overview of the subject described in detail herein. The overview is not intended to limit the protection scope of the claims.

An embodiment of the present disclosure provides a flexible display panel lamination device which is used for laminating a to-be-laminated flexible display panel onto a cover plate and includes a base and an elastic lamination part arranged on the base. The elastic lamination part is provided with a first surface for bearing the to-be-laminated flexible display panel and a second surface opposite to the first surface, the second surface is symmetrically provided with two supporting protruding ribs, the two supporting protruding ribs are respectively fixed in two fixation grooves formed on the base, a gap is formed between a portion, located between the two supporting protruding ribs, of the second surface of the elastic lamination part and the base, and a portion, close to the edge, of the second surface of the elastic lamination part is supported on the base.

After the drawings and the detailed description are read and understood, other aspects of the present disclosure can be understood.

BRIEF DESCRIPTION OF DRAWINGS

The drawings are provided for facilitating understanding the technical solution of the present disclosure, constitute one portion of the specification, and are used for illustrating the technical solution of the present disclosure together with embodiments of the present disclosure, but are not intended to limit the technical solution of the present disclosure.

DETAILED DESCRIPTION

The technical solution of the present disclosure will be illustrated below by embodiments in connection with the drawings. It can be understood that the embodiments described herein are merely used for explaining the present disclosure, but not intended to limit the present disclosure.

Figure 1:
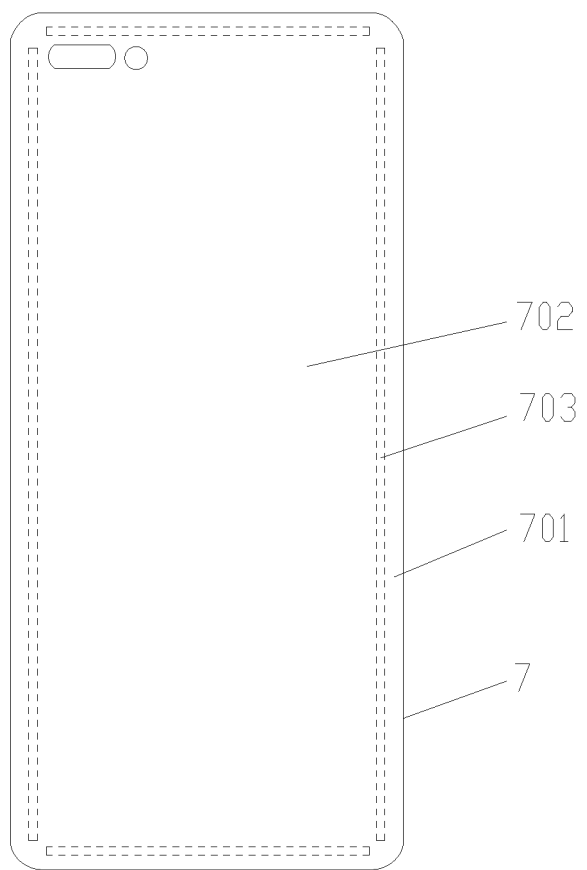
FIG. 1 is a structural schematic diagram of a flexible display panel with four bent edges.

As shown in FIG. 1, in OLED modules of some curved screen electronic products, a flexible display panel 7 includes a flat region 702 and a bent region 701 located at the edge, and by taking the flexible display panel 7 with a rectangular edge profile as an example, bent edges of the flexible display panel 7 may be two edges, three edges or four edges. The flexible display panel 7 shown in FIG. 1 is of a four-edge bent structure; the flexible display panel 7 subjected to pre-bending forming can be laminated on the inner side face of a cover plate by a lamination device, and the shape of the flexible display panel 7 subjected to pre-bending forming is consistent with that of the inner side face of the cover plate. After the lamination device completes lamination of the flexible display panel 7 and the cover plate, bubbles are liable to generate at four corners of the flexible display panel 7, and cracks are liable to generate at transitional positions (regions 703 where the cracks are liable to generate as shown in four dashed boxes in FIG. 1) between a bent region 701 and a flat region 702 of the flexible display panel 7.

Figure 2:
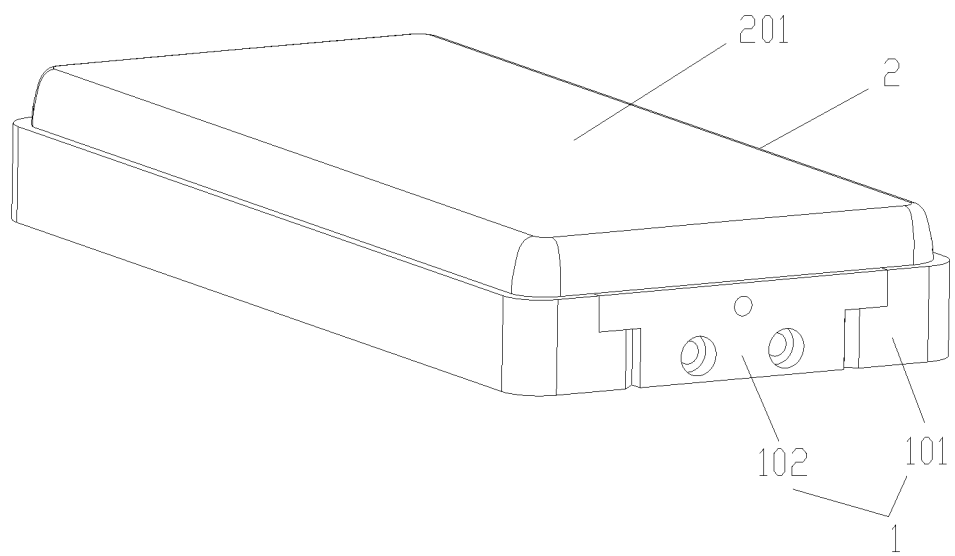
FIG. 2 is a structural schematic diagram of a lamination device according to an embodiment of the present disclosure.
Figure 3:
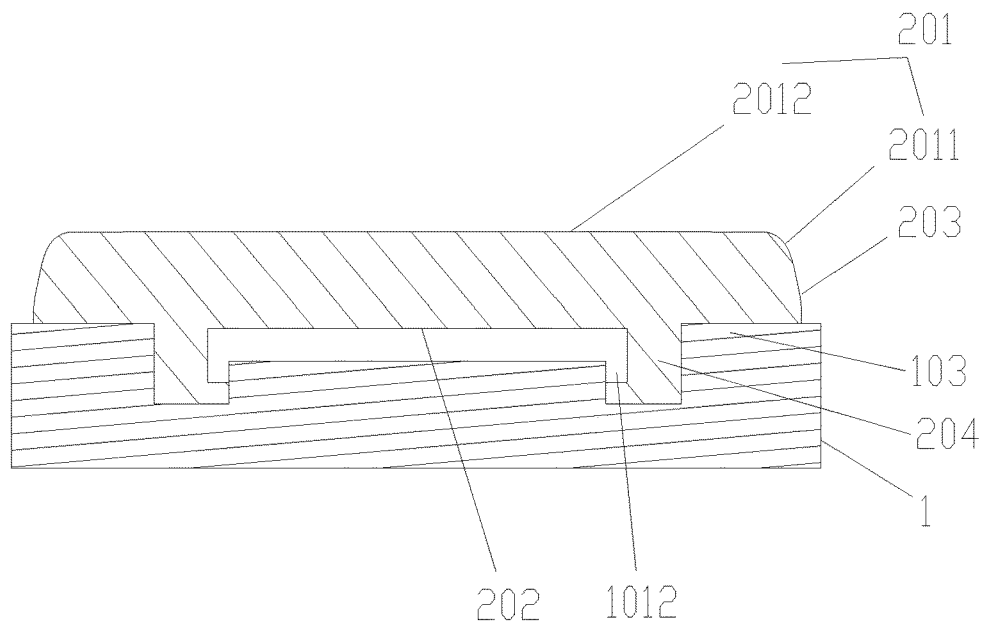
FIG. 3 is a section view of the lamination device in FIG. 2.
Figure 10:
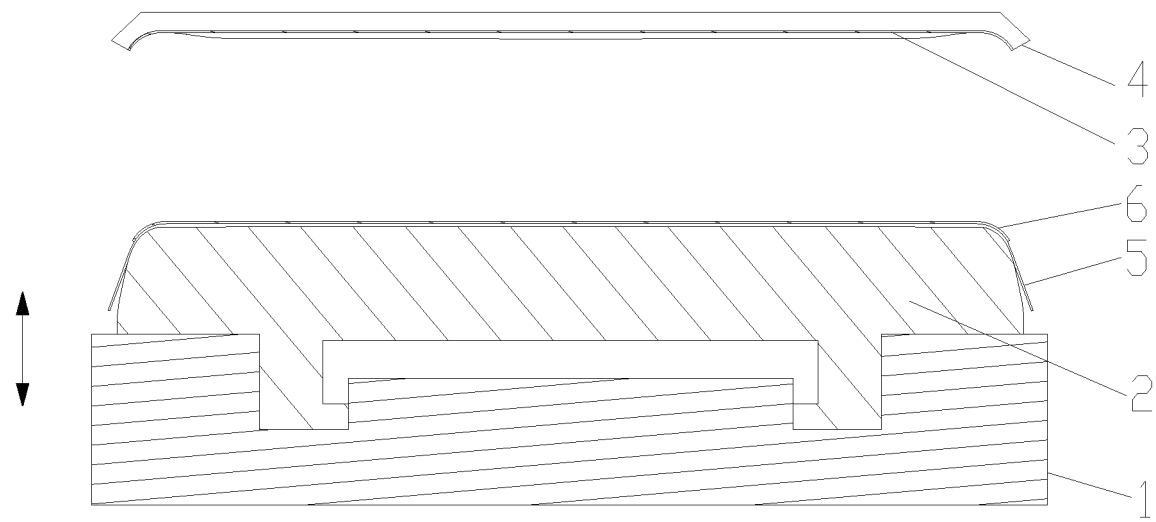
FIG. 10 is a schematic diagram of lamination carried out by adopting the lamination device as shown in FIG. 2 according to an embodiment of the present disclosure.

As shown in FIG. 2, FIG. 3 and FIG. 10, an embodiment of the present disclosure provides a flexible display panel lamination device which is used for laminating a to-belaminated flexible display panel 6 onto a cover plate 3 and includes a base 1 and an elastic lamination part 2 arranged on the base 1. The elastic lamination part 2 is provided with a first surface 201 for bearing the to-be-laminated flexible display panel 6 and a second surface 202 opposite to the first surface 201, the second surface 202 is symmetrically provided with two supporting protruding ribs 204, the two supporting protruding ribs 204 are respectively fixed in two fixation grooves 1012 formed on the base 1, a gap is formed between a portion, located between the two supporting protruding ribs 204, of the second surface 202 of the elastic lamination part 2 and the base 1, and a portion, close to the edge, of the second surface 202 of the elastic lamination part 2 is supported on the base 1.

According to the flexible display panel lamination device disclosed by the embodiment of the present disclosure, the elastic lamination part 2 can be fixed on the base 1 through two supporting protruding ribs 204 disposed on the second surface 202 of the elastic lamination part 2, the gap is formed between a portion (i.e., a middle region of the second surface 202 of the elastic lamination part 2), located between the two supporting protruding ribs 204, of the second surface 202 of the elastic lamination part 2 and the base 1, and a portion (a peripheral region of the second surface 202), close to the edge, of the second surface 202 is supported on the base 1, so that in the process that the base 1 drives the elastic lamination part 2 to move for carrying out lamination (in the laminating process, the elastic lamination part 2 is elastically deformed and presses the to-be-laminated flexible display panel 6 borne on the first surface 201 of the elastic lamination part 2 onto the cover plate 3), in one aspect, a pressure applied to the portion, close to the edge, of the to-be-laminated flexible display panel 6 by the base 1 through the elastic lamination part 2 is greater than that applied to the middle portion of the to-be-laminated flexible display panel 6, so that it can be avoided that bubbles are generated at four corners due to insufficient pressures at the four corner positions of the to-be-laminated flexible display panel 6; and in the other aspect, the portion, close to the edge, of the second surface 202 of the elastic lamination part 2 is supported on the base 1, so that in the laminating process, transitional positions between a bent region, close to the edge, of the to-be-laminated flexible display panel 6 and a flat region in the middle are more uniform stressed, and thus, generation of cracks at the transitional positions between the bent region and the flat region of the flexible display panel can be reduced, and as a result, the lamination yield is improved. In the practical application, on the premise of ensuring no bubbles, the crack defect rate of a production line can be reduced to 0.3% from 2.4%. Moreover, the flexible display panel lamination device disclosed by the embodiment of the present disclosure is high in applicability, is applicable to lamination of the large-radian cover plate and the flexible display panel, and is applicable to lamination of flexible display panels in forms, such as a one-edge bent form, a two-edge bent form, a third-edge bent form or a fourth-edge bent form and the like, and the cover plate.

Figure 7:
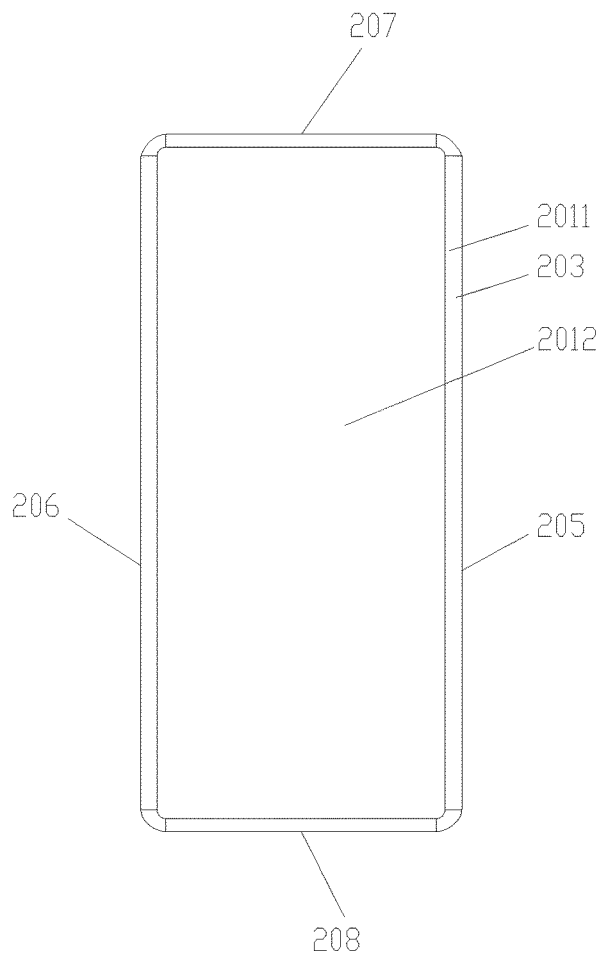
FIG. 7 is a top-view structural schematic diagram of the elastic lamination part in FIG. 6.

As shown in FIG. 3 and FIG. 6 to FIG. 10, the first surface 201 of the elastic lamination part 2 can include a first cambered surface 2011 close to the edge and a second cambered surface 2012 located in the middle, the first cambered surface 2011 is arranged to correspond to the bent region at the edge of the to-be-laminated flexible display panel 6, and the second cambered surface 2012 is arranged to correspond to the flat region in the middle of the to-be-laminated flexible display panel 6, wherein the radius of the second cambered surface 2012 can be 1,000 mm to 12,000 mm. The number of the first cambered surface 2011 can be set according to a case whether the corresponding edge of the to-be-laminated flexible display panel 6 is bent, and for example, the to-be-laminated flexible display panel 6 with a rectangular edge profile can be of a two-edge, three-edge or four-edge bent structure, then one first cambered surface 2011 is arranged at each of two, three or four corresponding edges of the first surface 201 of the elastic lamination part 2, i.e., the number of the first cambered surfaces 2011 is the same with that of the bent edges of the to-be-laminated flexible display panel 6. As shown in FIG. 7, exemplarily, the elastic lamination part 2 can be provided with four side edges forming a rectangle, the four side edges respectively are a first side edge 205 and a second side edge 206 which are opposite, and a third side edge 207 and a fourth side edge 208 which are opposite, the first surface 201 of the elastic lamination part 2 can be provided with four first cambered surfaces 2011, and each first cambered surface 2011 corresponds to the corresponding side edge of the elastic lamination part 2. A material of the elastic lamination part 2 can be silicone, rubber and the like, and the hardness can be 30A to 40A.

As shown in FIG. 3 and FIG. 6 to FIG. 9, the elastic lamination part 2 further can include a transitional surface 203 connected between the first cambered surface 2011 and the second surface 202, and the edge of the second surface 202 of the elastic lamination part 2 protrudes out of the edge of the first surface 201 of the elastic lamination part 2, wherein the transitional surface 203 can be an inclined surface or a cambered surface.

Figure 8:
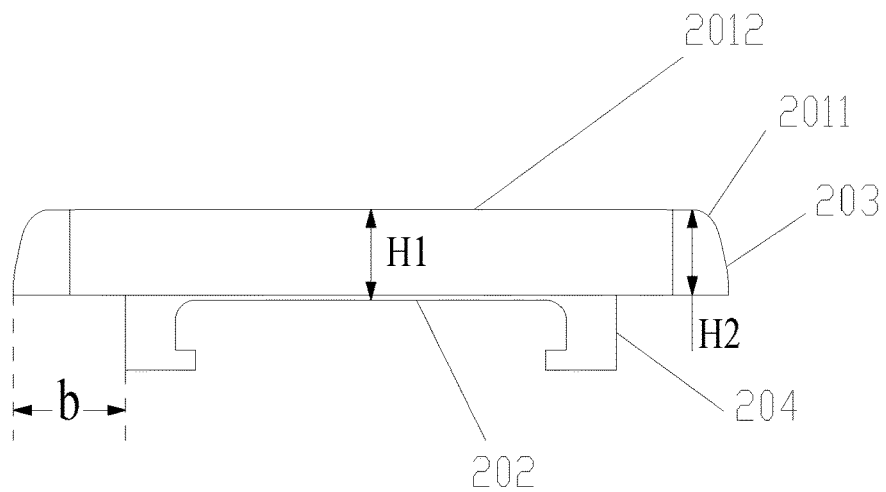
FIG. 8 is a front-view structural schematic diagram of the elastic lamination part in FIG. 6.
Figure 9:
FIG. 9 is a side-view structural schematic diagram of the elastic lamination part in FIG. 6.

As shown in FIG. 8, the two supporting protruding ribs 204 can be disposed in parallel, a distance between each supporting protruding rib 204 and the corresponding side edge, close to the supporting protruding rib 204, of the elastic lamination part 2 is b, and a range of the value of b can be 8 to 15 mm, wherein an extension direction of the two supporting protruding ribs 204 can be parallel to the long side edge of the elastic lamination part 2, in this embodiment, as shown in FIG. 7, the first side edge 205 and the second side edge 206 are long side edges, the third side edge 207 and the fourth side edge 208 are short side edges, and then the distance between one supporting protruding rib 204 and the first side edge 205 can be equal to that between another supporting protruding rib 204 and the second side edge 206 and can be equal to b. The section of the two supporting protruding ribs 204 can be of a rectangle shape or an L shape and the like, and two supporting protruding ribs 204 can be fixed in two fixation grooves 1012 of the base 1 by adopting an adhesive.

As shown in FIG. 6 to FIG. 9, in the embodiment of the present disclosure, the first surface 201 of the elastic lamination part 2 can be provided with four first cambered surfaces 2011, a distance between one end of each supporting protruding rib 204 and the third side edge 207 is m, a distance between the other end of each supporting protruding rib 204 and the fourth side edge 208 is n, and it can be set that the values of m, n and b are the same and all equal to 8 to 15 mm. Therefore, the portions, close to the four side edges, of the second surface 202 of the elastic lamination part 2 all can be supported on the base 1. In other embodiments, the first surface 201 of the elastic lamination part 2 can be provided with one, two or three first cambered surfaces 2011, and correspondingly, the to-be-laminated flexible display panel 6 can have one, two or three bent edges.

As shown in FIG. 8, a distance (for example, can be a shortest distance or a vertical distance) between a center position of the first surface 201 of the elastic lamination part 2 and the second surface 202 is H1, and the range of the value of H1 can be 3 to 8 mm. A distance (for example, can be a shortest distance or a vertical distance) between a joint of the first cambered surface 2011 and the second cambered surface 2012 of the first surface 201 of the elastic lamination part 2 and the second surface 202 is H2, and the range of the value of H2 can be 4 to 15 mm, wherein the second surface 202 can include a first portion (the middle region of the second surface 202) having a gap with the base 1 and a second portion (the peripheral region of the second surface 202) supported on the base 1. The first portion and the second portion can be coplanar, then the second surface 202 can be a plane; or, the first portion and the second portion can be not coplanar, then the second surface 202 can be an uneven surface.

The elastic lamination part is fixed on the base through two supporting protruding ribs disposed on the second surface of the elastic lamination part, the gap is formed between the portion, located between the two supporting protruding ribs, of the second surface of the elastic lamination part and the base, and the portion, close to the edge, of the second surface is supported on the base, so that in the process that the base drives the elastic lamination part to move for carrying out lamination (in the laminating process, the elastic lamination part is elastically deformed and presses the to-be-laminated flexible display panel borne on the first surface of the elastic lamination part onto the cover plate), in one aspect, the pressure applied to the portion, close to the edge, of the to-be-laminated flexible display panel by the base through the elastic lamination part is greater than that applied to the middle portion of the to-be-laminated flexible display panel, so that it can be avoided that the bubbles are generated at four corners due to the insufficient pressures at the four corner positions of the flexible display panel; and in the other aspect, the portion, close to the edge, of the second surface of the elastic lamination part is supported on the base, so that in the laminating process, the transitional positions between the bent region, close to the edge, of the flexible display panel and the flat region in the middle are more uniformly stressed, and thus, the cracks generated at the transitional positions between the bent region and the flat region of the flexible display panel can be reduced, and finally, the lamination yield is improved.

The embodiment of the present disclosure employs a finite element analysis software to determine the value ranges of b, h1 and H2 according to a simulation result. The simulation result shows that by adopting above value ranges of b, H1 and H2, in the laminating process, the lamination device can make the transitional positions between the bent region and the flat region of the flexible display panel more uniformly stressed, so that on the premise of ensuring that the bent region of the flexible display panel has a sufficient pressure, the stress of the transitional positions is reduced, the generated cracks are reduced, and the lamination yield is improved.

Figure 4:
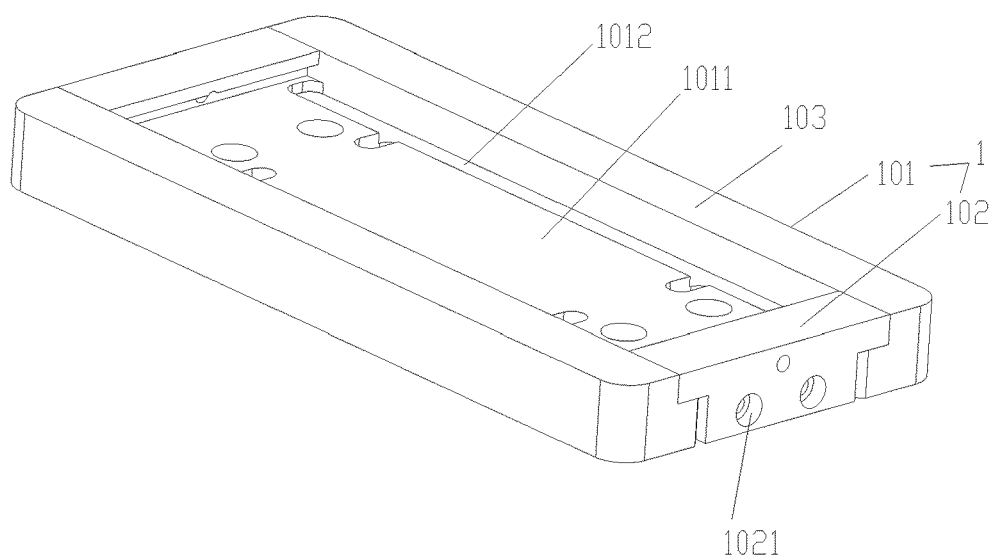
FIG. 4 is a structural schematic diagram of a base of the lamination device in FIG. 2.
Figure 5:
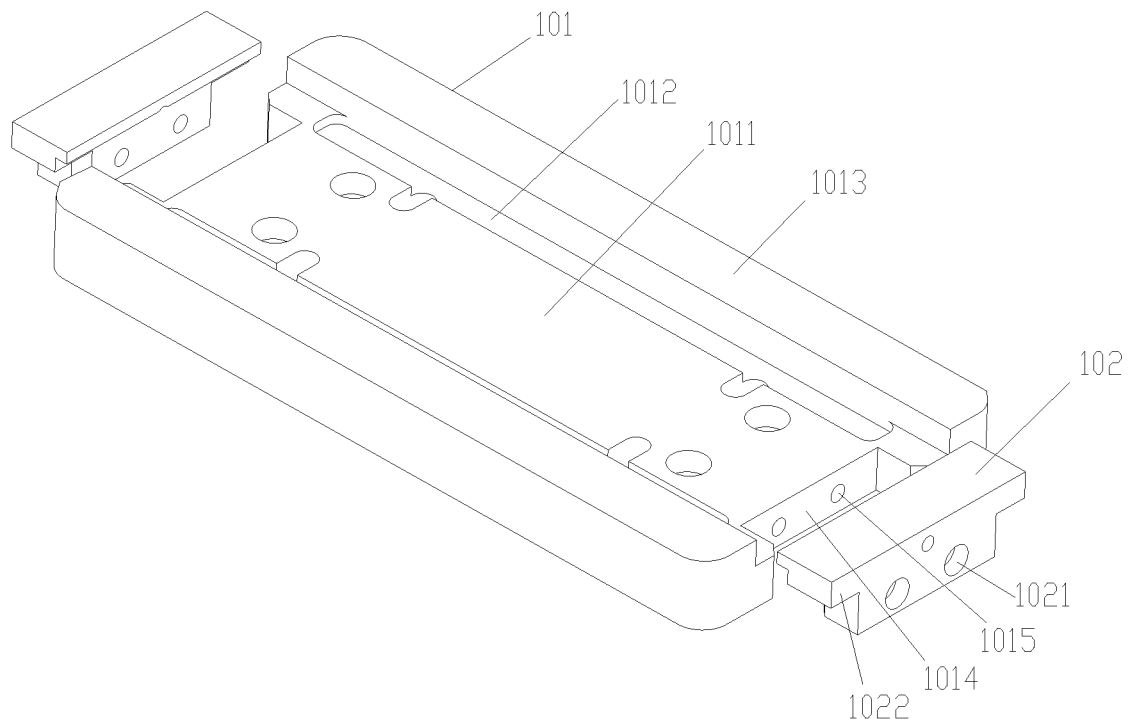
FIG. 5 is an exploded view of the base in FIG. 4.
Figure 6:
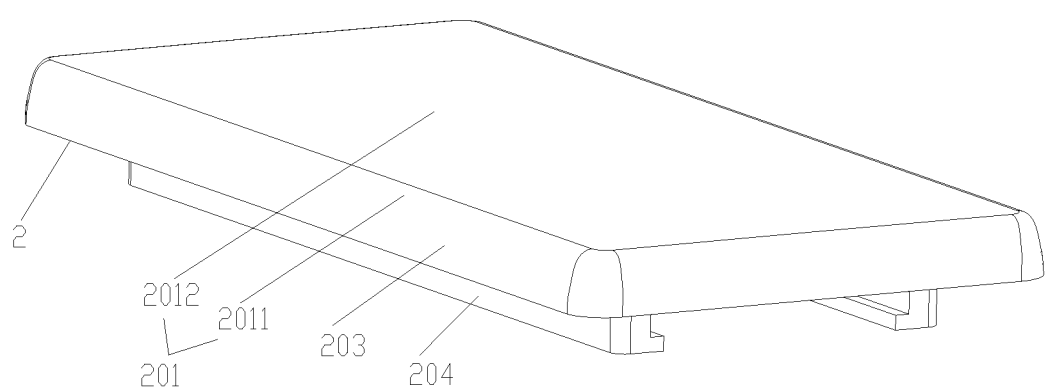
FIG. 6 is a structural schematic diagram of an elastic lamination part of the lamination device in FIG. 2.

As shown in FIG. 3 to FIG. 5, the base 1 can be provided with a third surface facing the second surface 202 of the elastic lamination part 2, the third surface of the base 1 is provided with a supporting edge 103, the portion, close to the edge, of the second surface 202 of the elastic lamination part 2, is supported on the supporting edge 103, and the two fixation grooves 1012 are formed on the third surface of the base 1, wherein the supporting edge 103 can be of a rectangle shape, and the portion, close to four side edges of the elastic lamination part 2, of the second surface 202 can be supported on the supporting edge 103. The width of the supporting edge 103 can be 8 to 15 mm. The material of the base 1 can be a hard material, e.g., metal or high-strength plastics.

As shown in FIG. 4 to FIG. 5, the supporting edge 103 can be of a rectangle shape, the base 1 can include a base body 101 and two stop blocks 102 respectively fixed at two ends of the base body 101 in a detachable manner, the third surface of the base 1 can include a fourth surface 1011 of the base body 101, the fourth surface 1011 of the base body 101 is provided with two protruding edges 1013 arranged oppositely, and the supporting edge 103 is formed by the portions, protruding out of the fourth surface 1011 of the base body 101, of the two stop blocks 102 and the two protruding edges 1013, wherein the two fixation grooves 1012 are formed on the fourth surface 1011 of the base body 101, and are arranged parallel to two protruding edges 1013. The opposite side surfaces of two protruding edges 1013 form the groove wall of the fixation groove 1012 close to the one protruding edge 1013 in the length direction, and the supporting protruding rib 204, located in the fixation groove 1012, of the elastic lamination part 2 can abut against the side surface of the corresponding protruding edge 1013. The end portions of two supporting protruding ribs 204 can abut against the opposite side surfaces of two stop blocks 102. Both the two stop blocks 102 can be respectively fixed on two end faces of the base body 101 through fasteners such as screws and the like, a notch groove 1014 can be formed on the end face of the base body 101, the lower portion of the stop block 102 is located in the notch groove 1014, a first fixed hole 1015 for inserting the fastener such as the screw and the like is formed at the groove bottom of the notch groove 1014, and a second fixed hole 1021 can be formed at the position, corresponding to the first fixed hole 1015, of the stop block 102. Bosses 1022 can be arranged on both sides of the upper portion of the stop block 102, and two bosses 1022 are supported on the fourth surface 1011 of the base body 101 and respectively abut against the opposite side surfaces of the two protruding edges 1013.

As shown in FIG. 10, the flexible display panel lamination device further can include a driving device (not shown) connected with the base 1, and the driving device can be configured to be capable of driving the base 1 to reciprocate so as to force the elastic lamination part 2 to move for carrying out lamination, wherein the driving device can adopt a device in which a hydraulic cylinder driving mechanism, a motor and a screw-nut transmission mechanism are matched, or a device in which the motor and a gear transmission mechanism are matched, and the like. The double sided arrow in FIG. 10 represents the direction in which the driving device drives the base 1 to reciprocate.

As shown in FIG. 10, the process of laminating the to-be-laminated flexible display panel 6 and the cover plate 3 by adopting the flexible display panel lamination device disclosed by the embodiment of the present disclosure can include: adopting a cover plate fixing jig 4 to fix the cover plate 3, making the inner side face (the to-be-laminated flexible display panel 6 finally being laminated to the inner side face of the cover plate 3) of the cover plate 3 face downwards, and the lamination device of the embodiment of the present disclosure being arranged below the cover plate 3. The to-be-laminated flexible display panel 6 can be subjected to pre-bending forming by adopting an auxiliary flexible Carrier Film (CF) 5 (the to-be-laminated flexible display panel 6 is attached to the flexible CF in the pre-bending forming process), and in addition, the flexible display panel 6 subjected to pre-bending forming can be fixed on the first surface 201 of the elastic lamination part 2 of the lamination device according to the embodiment of the present disclosure (the flexible CF 5 is placed on the first surface 201 of the elastic lamination part 2, and the side edge of the flexible CF 5 can be tensioned through a pulling mechanism arranged on the base 1 so as to fix the flexible CF 5 on the first surface 201 of the elastic lamination part 2). Before lamination, it can be ensured that the gap between the first cambered surface 2011 of the first surface 201 of the elastic lamination part 2 and the inner side face of the cover plate 3 is gradually increased from the inside of the first surface 201 to the edge position, so that the bubbles generated in the laminating process can be reduced. Next, the driving device drives the base 1 and forces the elastic lamination part 2 to move upwards towards the cover plate 3 (the cover plate 3 is kept fixed), and after the flexible display panel 6 subjected to pre-bending forming and borne on the elastic lamination part 2 is in contact with the cover plate 3, the pressure can be maintained for 5 to 10 s so as to laminate the flexible display panel 6 subjected to pre-bending forming on the cover plate 3. Then, the driving device drives the base 1 and forces the elastic lamination part 2 to move downwards, an external force applied to the flexible CF 5 by the pulling mechanism is removed, and the flexible CF 5 is released, then the laminating process is ended.

In the description of the embodiments of the present disclosure, unless expressly stipulated or defined, terms "connect", "fixedly connect", "mount" and "assemble" should be broadly understood, for example, they may be fixedly connected, detachably connected, or integrally connected; terms "mount", "connect" and "fixedly connect" may be directly connected, or may be indirectly connected by a medium, or internally communicated between two components. Those skilled in the art can understand the meanings of the terms in the embodiments of the present disclosure according to specific conditions.

What is claimed is:

1. A flexible display panel lamination device, for laminating a flexible display panel onto a cover plate, comprising: a base and an elastic lamination part arranged on the base, wherein:

the elastic lamination part comprises a first surface for bearing the flexible display panel and a second surface opposite to the first surface, the second surface is symmetrically provided with two supporting protruding ribs, the two supporting protruding ribs are respectively fixed in two fixation grooves formed on the base, a portion of the second surface between the two supporting protruding ribs has a gap with the base, and an edge area of the second surface is supported on the base, the first surface of the elastic lamination part comprises a plurality of first cambered surfaces close to edges of the first surface, the first cambered surfaces are arranged to correspond to bent edges of the flexible display panel, one of the plurality of first cambered surfaces is arranged at each edge of the first surface of the elastic lamination part, and a quantity of the first cambered surfaces is the same as a quantity of the bent edges of the flexible display panel, and the elastic lamination part comprises long side edges and short side edges, an extension direction of each of the two supporting protruding ribs are parallel to the long side edges of the elastic lamination part, a first side edge and a second side edge of the elastic lamination part are the long side edges, a third side edge and a fourth side edge of the elastic lamination part are the short side edges, a distance between one supporting protruding rib of the two supporting protruding ribs and the first side edge is equal to a distance between another supporting protruding rib of the two supporting protruding ribs and the second side edge and is equal to b, a distance between one end of each supporting protruding rib and the third side edge is m, a distance between the other end of each supporting protruding rib and the fourth side edge is n, and values of m, n and b are the same.

2. The flexible display panel lamination device according to claim 1, wherein the first surface of the elastic lamination part further comprises a second cambered surface located in the middle, and the second cambered surface is arranged to correspond to a flat region in the middle of the flexible display panel.

3. The flexible display panel lamination device according to claim 2, wherein the elastic lamination part further comprises a transitional surface connected between the first cambered surfaces and the second surface, and an edge of the second surface of the elastic lamination part protrudes out of the edges of the first surface of the elastic lamination part.

4. The flexible display panel lamination device according to claim 3, wherein the two supporting protruding ribs are disposed in parallel, and a distance between each supporting protruding rib and a corresponding side edge, close to the supporting protruding rib, of the elastic lamination part is 8 to 15 mm.

5. The flexible display panel lamination device according to claim 3, wherein a distance between a center position of the first surface of the elastic lamination part and the second surface is 3 to 8 mm.

6. The flexible display panel lamination device according to claim 3, wherein a distance between joints of the first cambered surfaces and the second cambered surface of the first surface of the elastic lamination part and the second surface is 4 to 15 mm.

7. The flexible display panel lamination device according to claim 2, wherein the base is provided with a third surface facing the second surface of the elastic lamination part, the third surface of the base is provided with a supporting edge, the edge area of the second surface of the elastic lamination part is supported on the supporting edge, and the two fixation grooves are formed on the third surface of the base.

8. The flexible display panel lamination device according to claim 7, wherein the elastic lamination part is provided with the first side edge and the second side edge which are opposite, and the third side edge and the fourth side edge which are opposite, and the supporting edge is of a rectangle shape.

9. The flexible display panel lamination device according to claim 7, wherein the base comprises a base body and two stop blocks respectively fixed at two ends of the base body in a detachable manner, the third surface of the base comprises a fourth surface of the base body, the fourth surface of the base body is provided with two protruding edges arranged oppositely, and the supporting edge is formed by the portions, protruding out of the fourth surface of the base body, of the two stop blocks and the two protruding edges.

10. The flexible display panel lamination device according to claim 1, further comprising a driving device connected with the base, the driving device being configured to be capable of driving the base to reciprocate so as to force the elastic lamination part to move for carrying out lamination.

11. The flexible display panel lamination device according to claim 8, wherein the base comprises a base body and two stop blocks respectively fixed at two ends of the base body in a detachable manner, the third surface of the base body comprises a fourth surface of the base body, the fourth surface of the base body is provided with two protruding edges arranged oppositely, and the supporting edge is formed by the portions, protruding out of the fourth surface of the base body, of the two stop blocks and the two protruding edges.

12. The flexible display panel lamination device according to claim 2, further comprising a driving device connected with the base, the driving device being configured to be capable of driving the base to reciprocate so as to force the elastic lamination part to move for carrying out lamination.

13. The flexible display panel lamination device according to claim 3, further comprising a driving device connected with the base, the driving device being configured to be capable of driving the base to reciprocate so as to force the elastic lamination part to move for carrying out lamination.

14. The flexible display panel lamination device according to claim 4, further comprising a driving device connected with the base, the driving device being configured to be capable of driving the base to reciprocate so as to force the elastic lamination part to move for carrying out lamination.

15. The flexible display panel lamination device according to claim 5, further comprising a driving device connected with the base, the driving device being configured to be capable of driving the base to reciprocate so as to force the elastic lamination part to move for carrying out lamination.

16. The flexible display panel lamination device according to claim 6, further comprising a driving device connected with the base, the driving device being configured to be capable of driving the base to reciprocate so as to force the elastic lamination part to move for carrying out lamination.

17. The flexible display panel lamination device according to claim 7, further comprising a driving device connected with the base, the driving device being configured to be capable of driving the base to reciprocate so as to force the elastic lamination part to move for carrying out lamination.

18. The flexible display panel lamination device according to claim 8, further comprising a driving device connected with the base, the driving device being configured to be capable of driving the base to reciprocate so as to force the elastic lamination part to move for carrying out lamination.

19. The flexible display panel lamination device according to claim 9, further comprising a driving device connected with the base, the driving device being configured to be capable of driving the base to reciprocate so as to force the elastic lamination part to move for carrying out lamination.

* * * * *